United States Patent [19]

Penfold et al.

[11] 3,995,187
[45] Nov. 30, 1976

[54] ELECTRODE TYPE GLOW DISCHARGE APPARATUS

[75] Inventors: Alan S. Penfold, Playa del Ray; John A. Thornton, Los Angeles, both of Calif.

[73] Assignee: Telic Corporation, Santa Monica, Calif.

[22] Filed: Mar. 3, 1975

[21] Appl. No.: 554,487

Related U.S. Application Data

[62] Division of Ser. No. 178,240, Sept. 7, 1971, Pat. No. 3,884,793.

[52] U.S. Cl. .................. 313/346 R; 313/30; 313/32; 313/37; 313/217; 313/146
[51] Int. Cl.² ................. H01J 1/14; H01J 19/06
[58] Field of Search ................. 313/30, 32, 37, 38, 313/146, 346, 217

[56] References Cited
UNITED STATES PATENTS

| | | | |
|---|---|---|---|
| 2,678,407 | 5/1954 | Brown et al. | 313/32 X |
| 2,802,125 | 8/1957 | Nedderman | 313/37 X |
| 3,090,891 | 5/1963 | Folson | 313/146 X |
| 3,612,932 | 10/1971 | Wilczek | 313/30 |
| 3,612,933 | 10/1971 | Troue | 313/32 |
| 3,816,784 | 6/1974 | Weninger | 313/32 |

Primary Examiner—Saxfield Chatmon, Jr.
Attorney, Agent, or Firm—Fulwider, Patton, Rieber, Lee & Utecht

[57] ABSTRACT

There is disclosed herein an electrode type glow discharge apparatus, such as that used for sputtering material from a cathode to provide a coating or the like on materials such as a substrate or substrates. Several exemplary embodiments are disclosed involving various combinations of constructional features including a flanged or spool type cathode, anode placement with respect thereto, provision of internal and/or external magnetic fields with field lines close to and substantially parallel with the barrel of the cathode, insulator placement, efficient cooling for anode and cathode, and the like. Furthermore, the assembly is constructed in a manner such that the same can be readily disassembled for enabling change of cathode materials and for cleaning cooling fluid passageways of the cathode and anode. Embodiments are described wherein at least a portion of the cathode may be in the form of a continuously moving member, such as a wire. The various constructional features enable apparatus to be provided which can create stable and uniform plasmas confined and controlled volume while operating at relatively low pressures with relatively low operating voltages.

6 Claims, 10 Drawing Figures

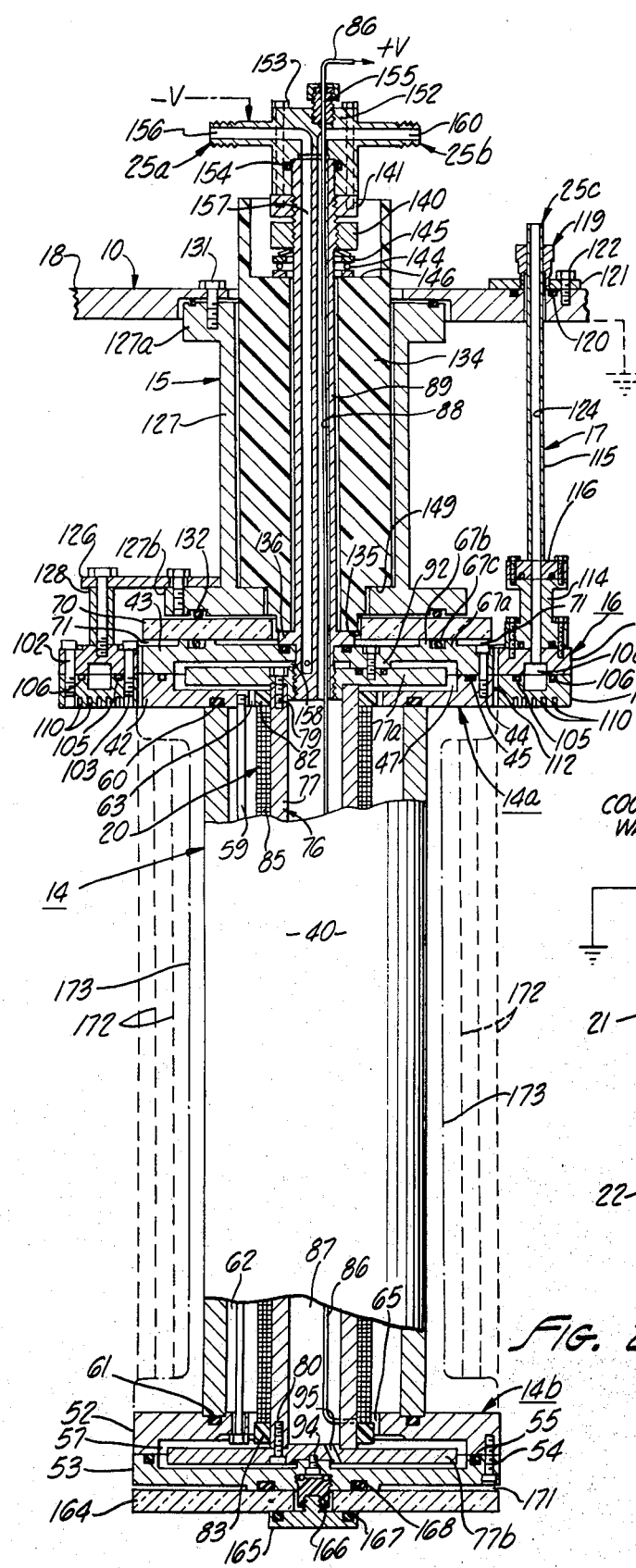
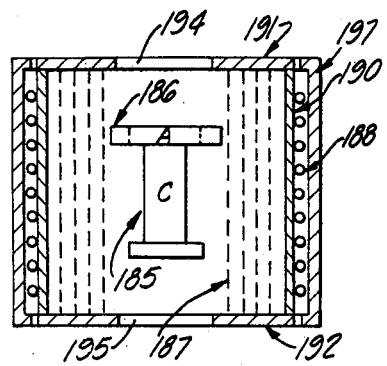
FIG. 3.
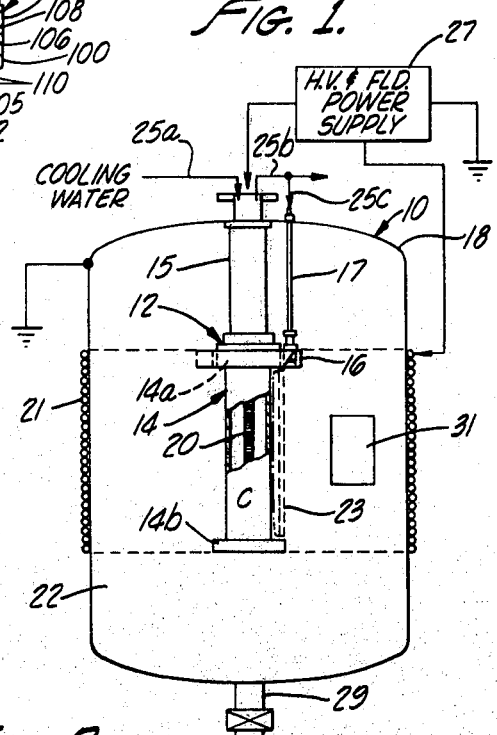
FIG. 1.
FIG. 2.

ELECTRODE TYPE GLOW DISCHARGE APPARATUS

This is a division of application Ser. No. 178,240, filed Sept. 7, 1971, now U.S. Pat. No. 3,884,793.

BRIEF SUMMARY OF THE INVENTION

This invention relates to electrode type glow discharge devices, and more particularly to improved devices and apparatus of this nature used for sputtering of materials.

Various types of electrode type glow discharge devices have been devised and used. Numerous patents have been granted and papers published describing various constructions and operational features of such devices. Some of the more interesting and relevant devices are disclosed in a paper by von F. M. Penning briefly entitled, "Die Glimmentladung Im Magnetfeld" beginning at page 873, Physica III, No. 9, November 1936; a paper by F. M. Penning et al appearing in the 1940 *Proceedings of the Royal Netherlands Academy of Science* entitled, "Cathode Sputtering in a Magnetic Field" beginning at page 41 thereof; British Patent No. 736,512 in the name of Holland published Sept. 1955; Penning U.S. Pat. No. 2,146,025 issued Feb. 1939; a paper by James R. Mullaly entitled, "Crossed Field Discharge Device for High Rate Sputtering" beginning at page 40 of the February 1971 issue of *Research/Development*; a paper by W. D. Gill et al entitled "Efficient Low Pressure Sputtering in a Large Inverted Magnetron Suitable for Film Synthesis" beginning at page 277 in *The Review of Scientific Instruments*, volume 36 No. 3, March 1965; a paper by K. Wasa et al entitled, "Sputtering in a Crossed Electromagnetic Field" beginning at page 71 of the *IEEE Transactions on Parts, Materials and Packaging*, Volume PMP-3, No. 3, September 1967; and a Proceeding letter by K. Wasa et al entitled "Efficient Sputtering in a Cold-Cathode Discharge in Magnetron Geometry" beginning at Page 2179 in the *Proceedings of the IEEE* Volume 55, No. 12, December 1967.

Although there has been constant improvement, change and evolution of devices in this field, the present concepts are believed to represent substantial new and novel improvements, including departures from prior practices, resulting in the provision of more efficient, stable and reliable devices of this nature.

The teachings of the present invention permit the design of improved apparatus for depositing films or coating, such as thin films, of material by the process of cathode sputtering. Additionally, these teachings permit the design of low pressure gas discharge devices, including light sources and radiation sources, which are efficient with respect to their ability to produce radiation having the wavelengths associated with electronic transitions in ionized gaseous species.

As an example of a principal application of the present concepts, consider the process of thin film deposition by cathode sputtering. A target composed of the material to be deposited is placed within a low pressure gas discharge and connected as a cathode. Ions from the gas discharge bombard the target and drive off, that is sputter, atoms of the target material. The substrate or item to be coated is suitably placed with respect to the cathode, so that it is in the path of the sputtered atoms. Accordingly, a thin film of the target material forms on the substrate surface. An important aspect of the usual sputtering process is that the sputtered atoms leave the target surface with considerable energy (e.g., 3 – 100 ev). If these atoms do not lose a significant fraction of their initial energy in their migration from the target to the substrate, they arrive at the substrate surface with sufficient energy to displace absorbed impurities and to penetrate into the substrate lattice. These self-cleaning and penetrating qualities of the sputtered atoms give sputtered processed films a superior adhesion quality as compared to thin films that are processed by other thin film deposition techniques, such as vacuum evaporation.

The sputtered yield (atoms sputtered per incident ion) depends on the energy of the incident ion (yield increases with ion energy). Thus, sputtering rate is a function of both the rate with which ions impact on the cathode surface and the energy of the imparting ions. The ion energy and rate of impact is dependent upon the rate of ionization in the glow discharge and the location of the region of ionization with respect to the cathode; that is, it is desirable that ions be produced adjacent the cathode so that their most probable behavior is to be drawn to the cathode and not to be lost to the walls of the discharge chamber.

Considering another case where the target is also the primary cathode that maintains the gas discharge, the ionization in such a discharge is maintained largely by the "primary electrons" which are emitted from the cathode target surface by the incident ions and by photo-emission, and acelerated in the cathode sheath. These electrons produce ionization by colliding with the neutral gas atoms within the volume of the glow discharge. The mean free path of the primary electrons increases with their energy, and thus with the voltage applied to the discharge, and varies inversely with the gas pressure in the discharge chamber. Hence, when discharge is operated at low pressures and high voltages (in order to get high ion bombarding energies), the resulting primary electrons acquire high energies with the consequence that they either produce ions at point far from the cathode, or are lost to the walls of the discharge vessel before they produce any ionization at al. The ionization process therefore is favored by increasing the gas pressure in the discharge. However, such an increase in the pressure reduces the energy of the ions impacting upon the target, and more importantly, severely dissipates the motions of the sputtered material in its migration to the substrate. As a result, some of the basic advantages of the sputtering process are lost.

Accordingly, an apparatus is desired which permits an intense glow discharge to be maintained over the target surface at low pressures (such as preferably around or less than $10^{-3}$ torr). The prior art suggests, for example, a magnetic field to restrict the motions of the ionizing electrons (see Kay U.S. Pat. No. 3,282,815) and a keeper discharge to uncouple the production of ionizing electrons from the sputtering process (see Moseson U.S. Pat. No. 3,393,142). These devices provide significant improvements in performance and permit discharges to be operated at pressures as low as $10^{-4}$ torr. However, they suffer the disadvantage of having planer geometries in which it is found difficult to maintain a uniform ion current distribution; that is, sputtering rate over the cathode (target) surface. Additional improvements in performance can be expected when magnetic fields are used with devices having a cylindrical cathode wherein the axis of the cathode parallels the field lines. By such means the radial motion of the primary electrons is restricted and they can be caused to remain close to the cathode surface until a substantial portion of their energy has been spent in ionizing collisions with the ambient gas. At the same time, by virtue of the geometrical symmetry, azimuthal uniformity of cathode current is achieved. The exterior surface of the cylinder may be used as the cathode surface or, as is illustrated by the hollow cathode apparatus shown in Kay U.S. Pat. No. 3,282,816, the interior surface may be used. With either geometrical variant it is found, in practice, that the primary electrons escape from the vicinity of the cathode, moving axially, while still carrying a substantial fraction of their energy. These "end losses" become increasingly significant as operation at lower and lower pressures is attempted and as cathodes of larger and larger diameter-to-length ratios are employed.

A primary object of the present invention is to provide an apparatus which permits maintenance of an intense glow discharge over a cathode, or sputtering target, at low pressures and which avoids difficulties associated with prior art devices, including the end losses previously described. One of the principal concepts of the present invention may be stated to be (1) creating an efficient discharge so that a minimum cost is paid per ion, (2) creating ions in a region such that a very high fraction of the ions are used for sputtering, (3) making the plasma discharge over the target surface have a distribution which creates a desired geometric source of sputtered material.

The present invention provides a trap for the primary electrons which restricts their motion both radially and axially, causing them to remain near the target surface until a large fraction of their energy has been expended in ionizing collisions. The present invention also provides the trap with an efficient anode contact so that the electrons can easily complete the current path once their energy has been extracted. With these provisions, desirable operating characteristics are obtained at low pressure. The plasma created by the trapped electrons essentially defines a cylindrical region about the target. The trap is achieved by a combination of electron reflection from surfaces at cathode potential, and elctron deflection by a magnetic field. In particular, electron reflection is used to prevent end losses. As electrons are injected into the trap their energy is used to make ions. Then when the primary electrons have given up their energy in making ions they are of no further value for ionization, but they are of value for maintaining current continuity. Therefore it is desirable tht the anodes be placed in a position so as to intercept the trap in such a way as to efficiently collect the low energy electrons without collecting the high energy ones.

Briefly, exemplary embodiments of the concepts of the present invention involve flanged cathode configurations which yield high cathode current densities at moderate to low voltages and at low ambient gas pressures. Two principal embodiments are disclosed wherein (a) plasma is generated on the outside of an outwardly-flanged cylinder, and (b) plasma is generated within a hollow inwardly-flanged cylinder. Both arrangements employ a magnetic field whose lines are generally parallel to the axis of the cylinders or cathode barrels. The strength of the field can be adjusted to confine the plasma to the vicinity of the walls of the barrel, essentially in the volume defined by the cylindrical surfaces of the barrel on the one hand and the periphery of the flanges on the other, so that the majority of the plasma ions are formed near the cathode sheath which exists along the cathode surface. Thus, such cathodes essentially rely on the simultaneous employment of magnetic and electric trapping of high speed electrons wherein the trap is formed as a consequence of intersection of individual magnetic field lines with the cathode sheath at two places, and the intersections occur within approximate perpendicular disposition of the sheath surface and the field lines. That is, essentially three sides of the electron trap are formed by the cathode sheath and the fourth side is formed by the magnetic field. Good plasma uniformity is obtained as a result of the symmetry of the construction. Such cathodes are efficient in their operation, and by adjusting the magnetic field strength as current is varied, operation can be achieved over a wide range of current with little or no change in required voltage. For purposes of sputtering, the surface areas of the cathode are constructed of the material to be sputtered (either made of the material or plated therewith) and an ambient gas with good sputtering characteristics (argon, neon, and so forth) is employed, or other gases are used to cause reactive sputtering to occur.

Such devices are useful for generating plasma for purposes such as causing cathodic sputtering to etch or clean the cathode material, causing cathodic sputtering for the purpose of applying metallic or dielectric coatings to stationary or moving surfaces placed near or within the generated plasma, and any other use requiring the generation of a plasma or a flux of sputtered material.

Accordingly, it is a principal object of the present invention to provide improved electrode type glow discharge apparatus.

Another object of this invention is to provide a new construction for electrode type glow discharge apparatus.

A further object of this invention is to provide apparatus of the aforementioned type which is capable of improved operation.

An additional object of this invention is to provide an improved method of glow discharge.

A further object of this invention is to provide a sputtering device for generating relatively uniform and confined plasma.

Another object of this invention is to provide a sputtering device employing a flanged type cathode operated with a magnetic field having field lines close to and substantially parallel with the barrel of the cathode.

Another object of this invention is to provide an improved cathode-anode connection.

A further object of this invention is to provide a sputtering device which can be readily assembled and disassembled for changing of cathode material or for cleaning thereof.

An additional object of the present invention is to provide a sputtering device having a novel placement of insulators therein, and within which plastic and/or elastomeric materials are not directly exposed to the vacuum chamber atmosphere.

A further object of this invention is to provide a new insulation arrangement for glow discharge apparatus.

These and other objects and features of the present invention will become better understood through a consideration of the following description taken in conjunction with the drawings in which:

FIG. 1 is a diagramatic elevational view of an electrode type discharge device according to the concepts of the present invention positioned within a vacuum chamber;

FIG. 2 is a detailed cross-sectional elevational view of a discharge device according to the concepts of the present invention;

FIG. 3 is a diagramatic elevational view of a modified form of a discharge device according to the present invention;

DESCRIPTION OF PREFERRED EMBODIMENTS

General Description

Figure 4A:
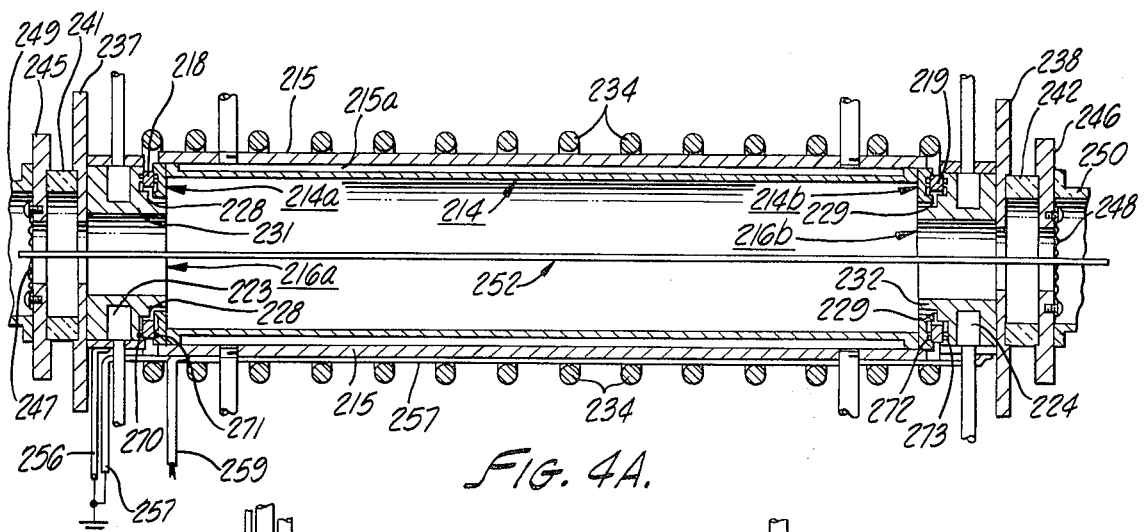
FIG. 4a is a cross-sectional elevational view of another form of discharge device according to the present invention.

Turning now to the drawings and first to FIG. 1, the same illustrates in diagramatic form a conventional vacuum chamber 10 having mounted therein an electrode type discharge device 12 according to the present invention. This Figure principally depicts a physical arrangement of the discharge device 12 within the vacuum chamber 10, the particular construction of the discharge device 12 being illustrated in FIG. 2 and discussed subsequently.

The discharge device 12 includes a "spool type" "winged" or "flanged" cathode 14 mounted within the chamber 10 and held by supporting means 15. The cathode 14 has an upper wing or flange 14a and lower wing or flange 14b. An annular anode 16 is disposed about the upper flange 14a of the cathode 14, and is supported by two or more hollow spacers, 17, such as attached to the cover of the vacuum chamber 10. A magnetic field is formed in the region over the surface of the cathode through the use of two magnetic field coil windings. One coil winding is disposed within the cathode 14. The other coil 21 winding 21 is disposed about the outer wall 22 of the vacuum chamber 10. The field windings provided by the external field coil 21 typically extend from slightly above to slightly below the cathode flanges 14a –14b. These coils provide a suitable resultant magnetic field with field lines close and parallel to the cathode barrel, such as is indicated by field lines 23 and which will be discussed in more detail later. The chamber 10 has a suitable gas therein, such as argon, and is evacuated to provide a low pressure environment.

Both the cathode 14 and the anode 16 are hollow, and a source of cooling water supplied through suitable lines 25a -25c is coupled with the apparatus for supplying cooling water through both the cathode 14 and anode 16. A combined high voltage and field power supply 27 is illustrated, it being understood that typically two separate supplies are used. This voltage source 27 is connected with the cathode 14 for supplying a negative voltage thereto with the anode 16 grounded, and for supplying power to the coils 20 and 21. The lower end of the vacuum chamber 10 includes a pipe 29 which may be coupled through a valve to a vacuum pump (not shown) in a conventional manner.

A substrate 31 is shown disposed within the vacuum chamber 10 to allow sputtering of a coating or plating thereon. The substrate 31 may be positioned in any convenient location between the cathode barrel and the side wall of the chamber 10 to apply a coating thereto as a result of sputtering from the cathode 14 as will be described in greater detail subsequently. The substrate may be held or mounted in position in any suitable manner. Portholes (not shown) or other covered openings can be provided in the outer wall 22 of the vacuum chamber 10 to allow access to the interior of the chamber 10 for observation, insertion, positioning, and removal of the substrate 31.

DETAILED DESCRIPTION

Turning now to a discussion of the particular details of the construction of an electrode type discharge device 12, an exemplary device of this nature is illustrated in FIG. 2 for sputtering a desired material, such as chromium, onto a substrate. The construction and components will first be described, followed by a discussion of the particular features and advantages thereof.

The discharge device 12 which is illustrated in FIG. 2 is shown attached to and depending from the top cover 18 of the vacuum chamber 10, this chamber typically being constructed of a non-magnetic metal, such as aluminium. The cathode 14 is attached to the support means 15 which is secured to the cover 18. Considering first the construction of the cathode 14, the same includes a cylindrical pipe or barrel 40 either formed of or plated with the material desired to be sputtered. An example of a suitable material is non-magnetic stainless steel with the exterior of the cathode barrel being chromium plated for sputtering chromium onto a substrate. The cathode 14 also includes the upper and lower wings or flanges 14a and 14b, each typically being of two-part construction to facilitate disassembly.

The top flange 14a includes a lower section 42 and an upper section 43. These sections are coupled together by means of a plurality of screw fasteners 44, and are sealed by an O-ring 45 to thereby form the upper cylindrical wing or flange 14a. This flange 14a includes an internal cavity 47 for receiving cooling fluid, such as water. The bottom flange 14b is of similar construction and includes upper and lower sections 52 and 53. These two sections are secured together by a plurality of screw fasteners 54, and are sealed by means of an O-ring 55. A similar cavity 57 is formed between the sections 52-53 for receiving cooling water. Preferably, the sections 42 and 52 are formed of non-magnetic metal, such as stainless steel plated with chromium (where chromium is to be sputtered), and the sections 43 and 53 are of magnetic metal, such as stainless steel. The choice of non-magnetic and magnetic materials as noted herein is preferred from the standpoint of their effect on the magnetic field lines, but is not mandatory. The use of magnetic and non-magnetic metals for the various parts aids in providing a magnetic field with field lines close and parallel to the barrel 40 of the cathode 14.

The wings 14a and 14b are secured to the barrel 40 by a plurality of tie rods 59, and O-rings 60 and 61 provide seals. An annular chamber 62 exists within the barrel 40 for receiving cooling water through an annular aperture 63 in the lower section 42 of the top flange 14a. A similar annular aperture 65 is provided in the upper section 52 of the bottom flange 14b. The upper section 43 of the top flange 14a includes a pair of annular spacer rings 67a and 67b, and an O-ring 67c disposed in the groove formed thereby to suitably space an upper insulator 70, of glass, pyrex, ceramic, quartz or other suitable material, from the upper surface of the upper section 43 of the top cathode wing 14a, indicated as annular gap or groove 71 for reasons which will be described in greater detail subsequently.

As noted earlier, the barrel 40 of the cathode 14 is either formed of, or plated with, the material to be sputtered. Depending upon the purity of the sputtered coating desired, the lower section 42 of the top flange 14a and the upper section 52 of the bottom flange 14b may or may not be of similar material or similarly plated. If a high purity coating is desired, the sections 42 and 52 should be of the material (or coated therewith) desired to be sputtered, although the major sputtering occurs from the cathode barrel 40 rather than the flanges 14a -14b. On the other hand, the sections 42 and 52 can be of other materials as long as a slight amount of contamination therefrom can be tolerated in the resulting coating. The latter simplifies changing of the apparatus for sputtering different coatings inasmuch as only the cathode barrel 40 needs to be changed. Furthermore, the barrel 40 can be of standard pipe size, and is but a cylinder, thereby allowing the use of standard pipe material for the barrel.

Turning now to the internal field assembly 20, the same includes a spool 76, which may be of magnetic stainless steel, having a cylindrical barrel 77 and upper and lower wings 77a and 77b, respectively. The wings 77a and 77b are secured to the barrel 77 by means of a plurality of screw fasteners 79 and 80. Rings 82 and 83 of plastic are disposed about the barrel 77 near the ends thereof, and a coil 85 of a plurality of turns of wire is disposed about the barrel 77 in between the rings 82–83. The wire may be insulated copper wire with one end (not shown) electrically connected to the barrel 77. The other end 86 thereof extends through a hole in the lower end of the barrel 77. The end 86 preferably is flexible and is fed through a central internal chamber 87 in the barrel 77 and upwardly through a hole 88 in a support tube 89 of the support means 15. Preferably, the internal field winding 85 has more turns near the ends thereof, that is, near the rings 82 and 83, to provide a more uniform magnetic field.

The internal spool 76 is supported within the cathode 14 by attaching the upper wing 77a of the spool 76 at a plurality of points 92 (only one being seen) to the inner surface of the upper section 43 of the top cathode flange 14a. The spool 76 also is supported and attached by means of a screw fastener 94 at the center of the inner surface of the lower section 53 of the bottom cathode flange 14b. This construction (particularly fastener 94 couples section 53 to the wing 77b) prevents outward bowing of the cathode wings caused by the high internal pressure (of cooling fluid above atmospheric pressure) within the cathode and the external low pressure within the vacuum chamber 10. The lower wing 77b of the spool 76 has a plurality of apertures 95 therethrough for return of cooling water through the central chamber 87 to the exterior of the entire assembly as will be explained later.

Turning now to the construction of the anode 16, the same includes lower and upper annular sections 100 and 101, which may be of non-magnetic stainless steel, coupled together by means of a plurality of screw fasteners 102 and 103 disposed around the sections. The sections are sealed together by means of inner and outer O-rings 105 and 106 to form an internal annular cavity 108 for receiving cooling water. The lower surface of the lower section 100 includes a plurality of annular grooves 110. The anode 16 is close to but spaced from the upper flange 14a of the cathode 14 as indicated at 112.

The anode 16 is held in position by two supports 17 connected to the upper cover 18 of the vacuum chamber 10, only one such support being shown. Both of these supports are alike and provide a ground connection for the anode to the cover 18, and one provides a cooling water inlet and the other provides a cooling water outlet. The support 17 includes a coupling 114 secured to the upper section 101 of the anode 16 by screw fasteners and sealed therewith by means of an O-ring. The support 17 further includes a tube 115 which may be silver soldered to a flange 116 which is connected with the spacer 114 by means of a plurality of screw fasteners and sealed therewith by means of an O-ring. The upper end of the tube 115 extends through an opening in the cover 18 of the vacuum chamber 10 and is secured thereto and sealed therewith by a threaded compression fitting 119 (which may include an internal O-ring, not shown), O-ring 120, cover plate 121, and one or more screw fasteners 122. It will be appreciated by those skilled in the art that the support 17 may be insulated from the vacuum chamber 10 so as to allow the anode 16 to be operated at a voltage other than at ground, but as shown and described the anode 16 operates at ground. The support 17 includes an interior passageway 124 for enabling cooling water to be supplied to the cavity 108 within the anode 16 and water return is through the second support (not shown).

Additional support for the anode 16 may be provided by means of a plurality of arms 126 (such as four, only one being shown) of metal, one end of which is fastened to a lower flange 127b of a top cap 127 of the support means 15 and the other end of which is attached through a spacer 128 to the upper section 101 of the anode 16. These arms also provide a ground connection to the anode.

Turning now to a discussion of the support means 15, the same includes the top cap 127 noted above. This cap has an upper flange 127a secured to the underside of the top cover 18 of the vacuum chamber 10 by means of a plurality of screw fasteners 131. The cap 127 includes a lower flange 127b, and the upper insulator 70 is sandwiched between this lower flange 127b and sealed therewith by an O-ring 132 and the rings 67a -67b and O-ring 67c on the upper surface of the upper section 43 of the top cathode flange 14a. The cap 127 and support tube 89 may be formed of non-magnetic stainless steel. An internal stem or lead-in insulator 134, which may be formed of plastic such as that sold under the tradename Lexan, is mounted within the cap 127, and has a lower cylindrical end engaging and fitting in an aperture 135 in the insulator 70.

The support tube 89 has a lower end threaded into the upper wing 77a of the inner spool 76 and has a flange 136 engaging and sealed with the upper surface of the upper section 43 of the top cathode flange 14a. The support tube 89 extends upwardly through the insulator 134, and has an upper threaded end to which larger local pressure and ultimately a short circuit between the anode and cathode because of this action. In the construction illustrated in FIG. 2, without such a tortuous path, any such out-gassing or arching that may occur at the annular gap 112 between the anode 16 and top cathode flange 14a, will then merely disappear into the general vacuum system. Furthermore, the annular gap 112 is parallel to the magnetic field lines 172, but the field lines across this gap are perpendicular to the lines 172 and thus prevent plasma from entering the gap 112 and arching thereacross.

If reactive sputtering were being performed, for example, where oxygen is entered into the system and oxides of the sputtered metal are formed, the lower face of the anode could become covered with an oxide. Such an oxide is an insulator which in turn would degrade the performance of the anode. A further and substantial improvement can be provided by forming the deep and close together grooves 110 in the bottom section 100 of the anode 16. These grooves essentially form a barrier to prevent a continuous coating of the bottom of the anode. The sputtered material moves from the cathode barrel 40 in the low pressure environment in a line-of-sight path. Although the sputtered material can land on the lower surface of the anode and outer sides of grooves, it cannot land in the bases and on the inner sides of the grooves 110 because of the line-of-sight movement of the sputtered material. Thus, the bottoms of the grooves 110 are not coated with such oxide and no continuous coating occurs, and a good anode connection is maintained even when oxides are involved. The general adherence of coatings to the anode can be improved by bead blasting its surface. In this way flaking and peeling of the coatings can be avoided.

Electrode discharge devices according to the concepts of the present invention for sputtering and other uses have a number of benefits and advantages, in addition to those already noted, over prior devices of this nature. Such advantages are discussed below, and although there is some inter-relationship and interaction between the various advantages, the order in which they are discussed is not necessarily in order of importance.

As mentioned previously, one of the principal advantages is that relatively low operating pressures can be used with apparatus constructed in accordance with the teachings of this invention. The use of relatively low pressures result in an essentially straight line emission and hence a line-of-sight sputtering onto a substrate. Some of the practical implications of this will now be discussed. Where high operating pressures are involved, such as in typical prior art apparatus, the sputtered material becomes gas scattered and tends to move in other than a line-of-sight direction. As a consequence, some of the sputtered material is turned back to the cathode and the deposition rate is reduced. In addition, the scattering causes coating not only a particular surface of a substrate facing the cathode, but also the sides and back thereof depending upon the mounting position of the substrate. As an example, four substrates may be mounted on a rotatable post and coated by the present apparatus, by coating one substrate, rotating the post and coating the next substrate, and so forth, without getting any significant gas scattering of the sputtered material (which would case with higher pressures) and therefore some coating of the substrates other than the one facing cathode.

Additionally, the use of relatively low pressures allows a large area of deposition. That is, the mean free path or average length of collisionless line-of-sight motion of the sputtered material varies inversely with the pressure so that a sputtering system such as the embodiment described above, which can be operated at relatively low pressures, permits substrates located at large radii to still see the line-of-sight flux of coating material discussed above. Thus, this invention permits the use of large chambers with the attendent large deposition areas. An exemplary radius of the vacuum chamber for apparatus according to the present invention is eighteen inches, but the operating pressure could be made low enough so the chamber size can be increased to place the substrates thirty inches or so away from the cathode without undergoing serious departures from the line-of-sight flux of the sputtered material. With three to six inch diameter cathode barrels satisfactory stable operation can be obtained for pressures ranging from $10^{-4}$ torr to in excess of $5\times10^{-2}$ torr. A pressure of $3\times10^{-4}$ torr appears to be optimum. If the cathode is as long as the substrate is away from it there does not appear to be any gain in making the cathode longer, other than to accomodate longer or larger substrates. An exemplary length for the barrel 40 for the cathode 14 is from several inches to substantially longer, and a reasonable exemplary length is 24 inches. Satisfactory stable operation can be obtained for cathode current densities ranging from 0.1 to greater than 15 milliamperes per square centimeter.

Finally, since this invention permits operation at such low pressures that sputtered material from all points along a cathode length can reach a given substrate position with line-of-sight trajectories, it is possible to analytically predict with considerable accuracy what the influence would be of baffles placed between the cathode and the substrate. Accordingly, such baffles can be used to deposit coatings with controlled gradations in coating thickness and to extend the substrate area over which uniform coating thicknesses are obtained. A good trap is formed according to the present invention between the cathode barrel 40 and flanges 14a-14b as indicated by the field lines 172 in FIG. 2. As noted earlier, it is desired that the field lines 172 be close and substantially parallel to the cathode barrel 40. This is accomplished, for example, by adjusting the current in internal and external field coils, and by the choice of magnetic and non-magnetic metals as noted earlier.

Another particularly important advantage is that the system is scalable. That is, the diameter and particularly the length of the cathode can be readily changed while still obtaining satisfactory operation in an essentially unchanged fashion. The cathode barrel 40 forms a quasi line source and thus, can readily be increased in length with a minimum of other changes. For example, the cathode barrel 40 may be from an inch or less long and up to ten or more feet long. The diameter may be 1/10 inch (such as where the cathode barrel is wire as will be discussed in connection with a discussion of FIGS. 4 and 5) and up to 6 inches in diameter and even larger. An exemplary size for coating of relatively small substrates is a barrel radius of 2¼ inches, length of 16 inches, flange radius of 4 inches, and with an operating voltage of approximately 850 volts and a field strength in the trap of 40 gauss.

Another advantage is the ability to operate with a relatively low voltage between the cathode and anode a main nut 140 and a nut 141 are secured. A thrust bearing 144 and bowed spring washer 145 are mounted about the upper end of the support tube 89 between an upper surface 146 of the insulator 134 and the bottom surface of the main nut 140. The spring washer 145 is used to take up thermal expansion and contraction.

As will be apparent from FIG. 2, the main nut 140 secures the cathode 14, along with the intermediate upper insulator 70, to the support means 15. In this manner, the threaded lower end of the support tube 89 coupled with the upper wing 77a of the spool 76 compresses together the top cathode wing 14a, upper insulator 70, top cap 27 and insulator 134. In this manner lower cylindrical shoulder 149 of the insulator 134 abuts the upper inner edge of the lower flange 127b of the cap 127 and provides the principal holding stress compressing together the upper rings 67a, 67b of the top cathode wing 14a and the lower surface of the lower flange 127b of the top 127 in a tightly abutting and sealed relationship with the respective surfaces of the upper insulator 70. The O-rings 67c and 132 on the top cathode wing 14a and lower flange 127b of the top 127 provide a seal. The insulator 134 is not exposed to the vacuum within the chamber 10. It is preferable that no plastic or rubber material be exposed to the vacuum within the chamber 10 because of the possibility of out-gassing from such materials which would in turn contaminate the atmosphere within the vacuum chamber 10.

A top fitting 152, which may be formed of brass, is attached to the upper end of the support tube 89 by means of a plurality of screw fasteners 153 attached to the upper nut 141, and a seal is provided by an O-ring 154. The upper end of the internal field coil lead 86 extends up through the fitting 152, and is sealed by a compression fitting 155. The fitting 152 includes an inlet chamber 156 for receiving cooling water, which may be tap water at room temperature and approximately 40 psi. This chamber 156 communicates with an inlet chamber 157 in the support tube 89 which has a plurality of holes like 158 at the lower end thereof communicating with the cavity 47 within the top cathode flange 14a. The tube 89 also includes the outlet passage 88 which communicates with an outlet passage 160 of the fitting 152. A suitable seal for the inlet and outlet passageways 156 and 160 with respect to the passageways 157 and 88 in the tube 89 may be provided by respective seals at the junctions of the respective passageways such as seals of Teflon.

The cooling water flows to the inlet line 25a and from the inlet passageway 156 of the fitting 152 through the passageway 157 in the tube 89 to the cavity 47 in the top cathode flange 14a, and is deflected around the upper wing 77a of the spool 76. Tap water rather than purified water, can be used because the apparatus can be readily disassembled for cleaning of the passages and cavities thereof. The cooling fluid exits the top cathode flange 14a through the annular aperture 63, and flows into the chamber 62 within the cathode barrel 40 and into the cavity 57 in the bottom cathode flange 14b. The fluid flows around the lower wing 77b of the spool 76 and up through the holes 95 into the central chamber 87 in the spool barrel 77. The wings 77a and 77b form baffles which direct the water in a manner to properly cool the cathode flanges 14a and 14b. The fluid then flows through the outlet passageway 88 of the tube 89 and to the outlet passageway 160 of the fitting 152. It should be noted that the construction of the apparatus shown in FIG. 2 provides a reliable apparatus with minimum chance of leakage of cooling water.

A length of plastic tube (not shown) may be connected between the outlet passageway 160 of the outlet line 25b of the fitting 152 and the inlet line 25c of the tube 115 to provide cooling fluid to the cavity 108 of the anode 16. A return path from the anode cavity 108 can be provided by a second support 17 as noted earlier. The connection between the lines 25b and 25c is of plastic material to insulate the cathode from the anode, and typically approximately ten feet of plastic tube is suitable.

The assembly of FIG. 2 finally includes a bottom section having a lower insulator 164 formed, for example of the same material as the upper insulator 70. The insulator 164 is sandwiched between a non-magnetic (such as aluminium) bottom cap 165 and the bottom of the lower section 53 of the bottom cathode flange 14b. A plastic insulator 166, formed of the same material as the insulator 134, is screwed into the section 53, and the cap 165 is screwed into the insulator 166. O-rings 167 and 168 provide a seal with the insulator 164, and the arrangement shown forms a long, narrow, annular gap 171 similar to the gap 71 between the upper insulator 70 and the top of the top cathode flange 14a. The various O-rings used may be of any conventional material such as Viton.

Turning again to the insulator 70, and the insulator 164, wherever there is metal-to-insulation contact, wherein the metal is at or near the potential of the cathode (or at least significantly away from the potential of the anode), a long and narrow slot or gap is provided, such as gap 71 at insulator 70 and gap 171 at insulator 164, with the gag being perpendicular to the magnetic field lines. This arrangement prevents the sputtered material from working its way along the gap and coating the surface of the insulator facing the gap which ultimately in turn would provide a conductive path and thus a short circuit. The magnetic field lines are indicated at 172 and it will be noted that the annular gaps 71 and 171 are perpendicular thereto. The field lines across the gaps 71 and 171 are parallel to the field lines 172. The perpendicular magnetic field lines keep electrons from passing into the gap and creating ionization therein. A similar long gap is not necessary between the bottom cap 165 and the lower insulator 164 inasmuch as the area of the bottom cap 165 is bathed in plasma and this cap is essentially at the potential of the anode.

During operation, there is a sheath 173 adjacent the cathode barrel 40. This sheath also extends, in effect, to annular slot 112 between the flange 14a and anode 16. Normally, with such a small gap 112, it would be expected that a lot of current would flow across the gap between cathode and anode and cause a short circuit; however, this does not occur because the sheath extends up to and encompasses the gap 112.

Furthermore the anode 16 is not closed at the back. In some prior constructions, the upper portion of the anode extends radially inwardly forming a gap between the anode and the upper surface of the top section 43 of the top cathode flange 14a (that is, in the vicinity of annular space 71). Were this to be done, local out-gassing may raise the pressure in the gap and make the gap region vulnerable to arching. Once arching starts, the local pressure is further increased, which in turn causes more out-gassing and arching thereby resulting in a resulting in two benefits. First, the sputtering yield (atoms sputtered per incident ion) increases less than linearly for higher ion energies. Thus, for a given power input more sputtering is obtained at low voltage operation than at high voltage operation. Second, low voltage high current operation means that high power levels can be delivered to the sputtering equipment without costly insulation problems in the design of the power supplies and the sputtering equipment per se. Although it depends on the cathode material, the typical operating voltage range is from about 500 to 1000 volts, and normally is approximately 850 volts for the apparatus illustrated in FIG. 2. The pressure can be increased, such as two to three times without significantly affecting the operating voltage.

A further advantage is that the operating current is proportional to the operating voltage raised to a large power. That is, current I is proportional to $V^n$, where $n$ is approximately 5 to 7. Thus, a small change in voltage gives a large change in current.

Another principal advantage of the present invention is that a good "anode connection" can be provided. This is a function of several facets of the present invention, including the flanged cathode construction and the ability to operate at relatively low pressures. Through the use of low operating pressures, it takes a longer time for an electron to jump or move across field lines. Normally, electrons move up and down field lines around the cathode barrel within the trap, and when they get to a cathode flange, the electrons are deflected back in the opposite direction. Because of this action, the electrons remain in the trap for a relatively long time. Electrons do, of course, move across field lines as a result of collisions and the like and although this action is random, the net result is an outward movement of electrons.

The term "good anode connection" is used with reference to placement of the anode 16 with respect to the flange 14a such that when an electron gets on a field line not intersecting the flange, the electron will be interrupted by the anode as soon as possible (or as close as possible to the cathode flange after the electron moves radially outward to a position such that it will not intersect the cathode flange). The result is that there is almost no voltage drop from plasma to anode and, thus, almost all of the applied voltage is being used advantageously. This operation is enabled through the relatively close position of the annular anode 16 with respect to the flange 14a, and a relatively small gap 112, so that the anode can intercept such electrons as soon as they move outwardly a radial distance past the radius of the cathode flange 14a. If the anode were positioned radially outward from the barrel 40, the electrons would have to hop across many field lines before reaching the anode thereby resulting in a large voltage drop between anode and plasma.

Additionally, the diameter of the lower cathode flange 14b preferably is slightly greater than the diameter of the upper cathode flange 14a so that electrons getting on a field line past the periphery of the upper flange 14a will move to and be intercepted by the anode 16 before they are lost past the bottom flange 14b. If the anode 16 were not in the position as shown in FIG. 2, such electrons would move upwardly and intercept the vacuum chamber wall 18 which, since it is grounded, can serve as an acceptable anode. On the other hand, the cathode 14 will operate successfully without the anode 16 positioned as shown, and, in fact, the vacuum chamber can serve as the anode. However, electrons would move downwardly, for example, toward the vacuum pump for the chamber and adversely effect (e.g., decompose) the vacuum pump oil, and plasma would be generated wherever the electrons go resulting in generating heat and ions in unwanted places rather than maintaining the plasma about the cathode barrel 40 and essentially within a peripheral boundary defined by the periphery of the cathode flanges 14a-14b. It is desirable for the plasma to hug the cathode and to be in the region to be sputtered and nowhere else. Although there is a slight bulge to the plasma in practice, it essentially exists in the desired sputtering region and nowhere else with the constructions according to the present invention. This results in a very clean sputtering system without spurious discharges.

An additional advantage is that substrate heating is held to a minimum because there is very small substrate radiation and plasma bombardment. This results because the plasma is contained around the cathode. Therefore, the apparatus can be used with substrate materials that melt or off-gass easily, and also, with the apparatus there is not significant modification of the structure of substrate materials because of electron bombardment. On the other hand, electron bombardment can be achieved if desired by turning off the magnetic fields.

Another advantage is that excellent water cooling of both the cathode and anode can be easily achieved. This permits the apparatus to be sealed to very high current densities.

A further advantage is that the overall system is electrically very stable. Devices of the nature shown in FIG. 2 have been operated for may hours, such as 8, with only 2 or 3 per cent drift. Once the operating voltage, current and pressure are set, they do not vary significantly with time.

An additional advantage is that the cathodes may be provided at low cost. Although this is true for certain post type cathodes of the prior art, this advantage is still retained even with the flanged type cathode construction of the present invention. Additionally, the cathode assembly may be readily taken apart for change of the barrel material 40 of for cleaning of the cooling water passages therein. This also means that it is not necessary that a "spool" shape be machined in order to provide the flange cathode construction.

A further advantage is that the insulators 70 and 164 appear to last indefinitely, principally because of the provision and arrangement of gaps 71 and 171.

Also, with the arrangement illustrated in FIG. 2 for example, the only materials exposed to the vacuum within the chamber are metals and the insulators 70 and 164 which typically are formed of pyrex, ceramic, quartz and the like. Thus, there are no elastomers or plastics exposed to the vacuum which could cause outgassing problems.

An additional advantage is the ability to provide a stable current density over a large area. The uniformity of the sputtering material is thus good over a large range of current density, for example up to 15 ma/cm$^2$ and down to 0.1 ma/cm$^2$. The current density is a function of total current divided by the cathode area carrying current, the latter being determined by observing the sheath 173.

Another advantage is that improved results can be obtained by bead blasting parts of the cathode assembly. This is particularly important with respect to the outer surface of the upper flange 14a facing the annular space 112 and the anode 16. Inasmuch as these surfaces will ultimately obtain a coating thereon, the bead blasting thereof helps the coating to adhere thereto so that the resulting coating will not peel and contaminate the system.

The operating voltage V may be considered to be an index of discharge efficiency, and may be expressed as $$V = \frac{E_i}{\gamma \epsilon_1 \epsilon_2}$$

Where $E_i$ = the average energy expended to form one ion by an electron.

$\gamma$ (gamma) = ion-electron secondary emission coefficient due to ion bombardment for the cathode material, $\epsilon_1$ (epsilon) = the fraction of electron energy lost in the trap, and $\epsilon_2$ = fraction of ions which reach the cathode.

$E_i$ is a function of the characteristic of the gas being used. In the case of argon, for example, it is approximately 30 electron volts (ev) per ion. Gamma for an argon environment is approximately 0.1, that is, one in ten ions hitting the cathode creates one electron to be emitted into the plasma, with the remainder being lost in the metal of the cathode, and so forth. These emitted electrons are accelerated in the cathode sheath and acquire an energy approximately equal to the applied voltage V. As these electrons are trapped and lose energy, they create plasma, which in turn creates more ions, which in turn causes sputtering and creates more electrons, and so forth. If the trap provided by the magnetic field is very efficient, $\epsilon_1$ is unity (1) and all electrons are trapped until they lose all energy. Some ions will drift out of the plasma and some will be pulled to the cathode and, thus, $\epsilon_2$ will not normally be unity. $\epsilon_2$ is the fraction of the ions pulled to the cathode, and varies from a minimum of zero to a maximum of one. With a perfect trap, the product of $\epsilon_1$ times $\epsilon_2$ is unity, in which case the operating voltage would be 300 volts for a perfect system. In the present exemplary system, the operating voltage is approximately 800 and thus the the product of $\epsilon_1$ times $\epsilon_2$ is approximately 0.3 which indicates an efficiency of 30 percent. In the hollow cathode systems to be discussed subsequently, the "wrap-around" geometry favors a high $\epsilon_1$. Consequently, typical operating voltages are about 400 volts and the product of $\epsilon_1 \times \epsilon_2$ is 0.75.

Returning again to the FIG. 2 type construction, it is, of course, desired that $\epsilon_1$ and $\epsilon_2$ be high and close to one. This is accomplished by having an efficient trap, as noted above, and disposition of the trap as close as possible to barrel of the cathode. Thus, the creation of an efficient discharge makes $\epsilon_1$ closer to one, and creation of ions as close as possible to the cathode so that a large number are close to the cathode makes $\epsilon_2$ closer to unity. Gamma, as noted, is sensitive to the gas environment used and is approximately 0.1 for argon. $E_i$ changes with the gas used, but typically is approximately 30 ev/ion as noted above for typical gasses used for sputtering. In the usual prior sputtering apparatus, the applied voltage is approximately 3000 volts necessitating great care in providing proper insulation. On the other hand, with the use of lower voltages (such as 800 to 850 volts), as is possible with apparatus according to the present concepts, the insulation problems with respect to both the cathode and a power supply therefor are substantially minimized.

Examples of substrates and other materials to be coated are well known to those skilled in the art. An example is the application of metal coatings on glass such as glass sheets of various size, for example, 2 inches by 2 inches, 12 inches by 14 inches, and so forth. If desired, a mask can be positioned in front of the cathode barrel 40, radially disposed therefrom, to improve the uniformity of the deposition over a large area or to provide selective non-uniformity. This masking is facilitated by the ability to use relatively low pressures within the chamber thereby resulting in the line-of-sight coatings. Other examples of coatings are chromium, stainless steel, titanium, and so forth, on glass and the resulting article is then etched in a conventional manner for optical uses, and an exemplary coating of this nature is one of chromium 650 A thick. Other examples include applying a flash coating of copper to 6 inch by 6 inch sheets of alumina where the flash coating is approximately 5000 A thick to provide an underlayer for subsequent plating.

Although both an internal and external magnetic field are provided with the apparatus of FIG. 2, it will be appreciated that either one or both can be used, particularly when appropriate materials are selected for the components and with or without the use of magnetic plates for affecting the field lines. As noted earlier, it is particularly desirable that the field lines be close to and essentially parallel to the cathode barrel 40. This can best be accomplished through the use of both an internal field and an external field, wherein both can be adjusted to achieve the desired resultant field. Then, when it is necessary to adjust the field strength, both fields can be adjusted together while still maintaining the proper disposition of the field lines with respect to the cathode.

As to the strength of the field, it is desirable that the same be at least strong enough so that an electron on its first pass from the cathode barrel does not pass radially outside of the cathode flange area. As an example, with flanges having a radius of approximately 4 inches, a cathode having a radius of approximately 2¼ inches, and an operating voltage of approximately 800 volts with the apparatus of FIG. 2, the minimum field B is approximately 30 gauss in the trap resulting from both the internal and external fields. However, typical operation with the apparatus of FIG. 2 as noted above is preferably around 40 gauss. (The apparatus of FIG. 4 which will be discussed subsequently, typically is operated with 100 to 300 gauss.) The field windings of the external field 21 seen in FIG. 1, and used with the apparatus of FIG. 2, preferably extend just above and just below the upper surfaces of the cathode flanges 14a-14b as noted earlier.

As will be apparent to those skilled in the art, the field resulting from the internal coil 85 will be bowed outwardly from the cathode barrel 40; whereas the field from the external coil 21 will be bowed inwardly toward the cathode barrel, particularly with the cathode materials used for the apparatus of FIG. 2 as described previously. The field lines from the field resulting from the external field coil 21 will be almost perpendicular to the cathode barrel 40 as such lines leave and re-enter the barrel. By relatively adjusting the two fields, the radial component of the inner field can be cancelled by the radial component of the outer field. This can be determined through the use of a gauss meter to detect the radial fields, and then the fields adjusted to eliminate the radial component. This will result in field lines 172 in the trap area (between the periphery of the cathode barrel 40 and an outer imaginary cylindrical space defined by the outer face of the cathode flanges 14a-14b) which are substantially parallel to the cathode barrel 40 and very close thereto. If it is not desired to employ an internal field, preferably the cathode and any interior components are made of non-magnetic material so as to minimize the effect thereof on the external field. An example of this latter modification is shown in FIG. 3 and is discussed below.

FIG. 3 diagrammatically illustrates another form of the present concepts involving the use of a cathode-anode structure similar to that of FIG. 2, but without an internal field coil and with a modified form of vacuum chamber. In the arrangement of FIG. 3, there is shown a cathode 185 similar to the cathode 14 of FIG. 2 and an anode 186 similar to the anode 16 of FIG. 2. The choice of magnetic and non-magnetic materials for the device of FIG. 2 is not critical but the particular selection discussed earlier aids in maintaining the field lines parallel to the cathode barrel 40. In the embodiment of FIG. 3, however, the cathode 185 should not include any internal spool of magnetic material and field winding such as 76 and 85, respectively, of FIG. 2, and both the cathode 185 and anode 186 are formed of non-magnetic metal so as to prevent deviation or bending of the magnetic field lines toward and into the cathode and anode; that is, so that cathode and anode do not affect the field lines 187 provided by an external field winding or windings 188.

In the embodiment of FIG. 3, an external cylindrical non-magnetic metal housing 190 is provided having upper and lower collars 191 and 192 of magnetic metal secured thereto. These collars serve to straighten the field lines 187 as illustrated in dashed lines FIG. 3. Also, in the apparatus of FIG. 3, the housing 190, and top and bottom collars 191–192 preferably form the housing of the vacuum chamber, it being appreciated that suitable gussets or other stiffening devices may be used in the construction thereof to insure that the housing can withstand the relatively low internal pressures involved. An upper opening 194 is provided for allowing the cathode/anode structure to be inserted into the chamber, and a lower opening 195 is provided for coupling the chamber with a valve and vacuum pump equipment. Furthermore, an iron jacket or the like 197 is provided to confine and concentrate the magnetic field within the chamber. The collars 191–192 are employed to provide the straight field lines, but these are not necessary if an internal field winding is provided within the cathode 185.

As an alternative to the arrangement of FIG. 3, the assembly shown can be disposed entirely within a vacuum chamber, rather than forming the vacuum chamber; however, the gap or space between the exterior of the assembly of FIG. 3 and the interior of a vacuum chamber is not available to be coated but, on the other hand, can trap water vapor and other contaminants which in turn affect the quality of coatings formed with the apparatus. As another alternative, the collars 191–192 may be disposed outside a vacuum chamber within which the cathode 185 and anode 186 are mounted. Still another arrangement is possible wherein the cathode structure of FIG. 2 is used in the apparatus of FIG. 3, and the end plates 191 and 192 increase and improve the field strength at the cathode.

Figure 4B:
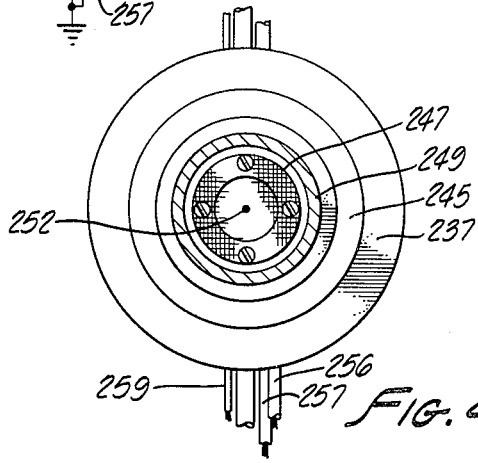
FIG. 4b is an end view thereof.
Figure 4C:
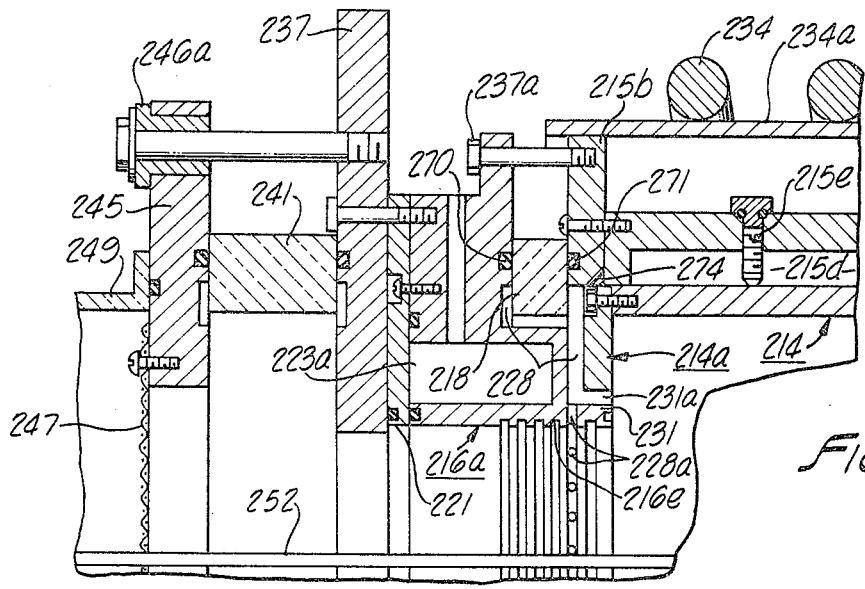
FIGS. 4c and 4d are enlarged fragmentary views showing more detail of the device of FIG. 4a and modifications thereof.
Figure 4D:
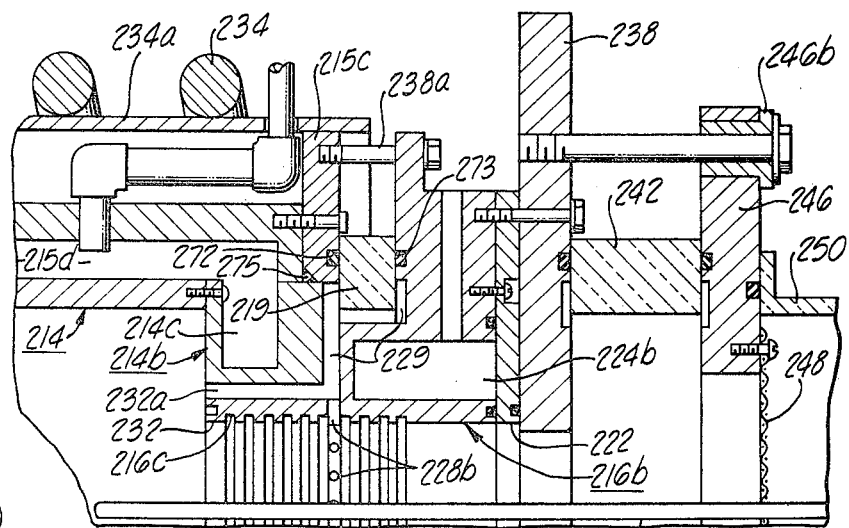

Turning now to FIGS. 4a through 4d, the same illustrate another embodiment, and modifications thereof, of the present concepts involving a flanged hollow cathode assembly which is, in a sense, the reverse of the cathode 14 of FIG. 2 but quite similar and operates in a similar manner. FIG. 4a generally illustrates this entire assembly, and FIG. 4b is an end view thereof; whereas, FIGS. 4c and 4d are fragmentary views which illustrate in detail preferred alternative constructions for the ends of the assembly. FIG. 4c is a fragmentary view showing a portion of the left end of the assembly, which can be used at both ends. FIG. 4d is a fragmentary view of the right end of the assembly, which likewise can be used at both ends of the assembly.

In FIG. 4a, a hollow cathode is shown having a cathode barrel 214 and end flanges 214a and 214b. The barrel is cylindrical, and the flanges 214a-214b are in the same form of annular rings. These flanges may include cooling water passages 214c as shown in the modification of FIG. 4d. The cathode barrel and flanges are either fabricated from the material to be sputtered, or from a non-magnetic material such as aluminum or stainless steel with the material to be sputtered plated or plasma sprayed on the inner surface. Typical thickness for such plated or plasma sprayed coatings are in the range 10 to 100 mils. The replaceable cathode barrel 214 may be welded to an outer cylindrical housing 215 as shown in FIG. 4a and form an annular cavity 215a for receiving cooling water. Preferably the barrel 214 is captured inside the housing 215 by seal rings 215b and 215c as shown in the modifications of FIGS. 4c and 4d, respectively, to form an annular cavity 215b by means of ring insulators for receiving cooling water.

Annular anodes 216a and 216b are provided, and are insulated with respect to the cathode by means of ring insulators 218 and 219 formed of the same material as the insulator 70 of FIG. 2. Grooves 216c are shown in the anode surfaces. As discussed with respect to FIG. 2, the grooves and/or bead blasting are provided to improve the adhesion of the sputtered material that is incident on the anode surface. The anodes 216a and 216b have respective cooling water cavities 223 and 224, and preferably are attached to respective anode end plates 221 and 222 as shown in FIGS. 4c and 4d to form respective cooling water cavities 223a and 224b. By removing the end plates 221–222, the cooling water cavities may be periodically cleaned.

Elongated narrow annular gaps 228 and 229 (FIGS. 4a, 4c and 4d) are provided between the cathode and anodes and the insulators 218 and 219. These gaps are similar in nature and function to the gaps 71 and 170 of the assembly shown in FIG. 2 and are perpendicular to the field lines provided by a magnetic field coil 234. A series of holes 228a and 228b as shown in respective FIGS. 4c and 4d can be added to assist in removing the out-gassing from these gaps and thereby reduce the out-gassing problem discussed with reference to FIG. 2. A second set of gaps 231 and 232 (FIG. 4a) and 231a and 232a (FIGS. 4c and 4d) are formed between the respective cathode flanges 214a and 214b and respective annular skirts 231 and 232 of the anodes 216a and 216b. These gaps 231 and 232 and 231a and 232a are parallel to the magnetic field lines.

In practice, the field coil 234 typically is comprised of a plurality of windings formed on suitable mandrels of non-magnetic metal (e.g., aluminum) and located on an insulating shield 234a (FIGS. 4c and 4d) which insulates the windings from the cathode outer housing 215. These windings are then disposed along the assembly illustrated in FIG. 4. That is, each winding 234 of FIG. 4 represents, in a preferred structure, a plurality of coils. These coils may be positioned and the magnetic coil currents may be adjusted to provide the desired magnetic field within the cathode. Magnetic end plates 237 and 238 may be attached to the outer ends of respective anodes 216a and 216b. The magnetic field lines are drawn through the plates 237–238 to make the magnetic field lines pass through the anodes and thereby improve the anode connection. The magnetic end plates are preferably formed of iron. The anode magnetic end plate assemblies are attached to the cathode as to capture the insulators 218 and 219 by a series of bolts 237a and 238a (FIGS. 4c and 4d) which thread into the seal rings 215a and 215b, said seal rings being fabricated from an insulating material such as a polycarbon plastic.

A pair of cylindrical insulators 241 and 242, which may be of material the same as that as the insulators 218 and 219, are disposed at the outer ends of the magnetic endplates 237 and 238 and adjacent respective ground shields 245 and 246. The ground shields permit the plasma discharge to be confined within the hollow cathode when the technique of bias sputtering is effected on a grounded substrate. That is, one power supply is used to drive the anode at an electrical potential of a 100 volts or so positive with respect to the grounded substrate. A second power supply drives the cathode at a potential of several hundred volts negative with respect to the substrate. The plasma generated by the ensuing discharge will exist at near the anode potential. Thus the grounded substrate will be negative with respect to the plasma and sputtering will occur from the substrate surface. The relative potentials are adjusted so that the sputtering rate from the substrate is less than the deposition rate and a net deposition occurs. This substrate sputtering provides a continual cleaning of the substrate during the deposition process. The end shields 245–246 assure that the positive driven anodes do not draw current from the vacuum pumps and other grounded elements within the system. Suitable end fittings 249 and 250 may be attached at the ends of the apparatus. The end fittings 249–250, ground shields 245–246, and outer insulators 241–242 are secured to the plates 237—237 by suitable bolts or tie rods. Said bolts or tie rods are insulated as shown in FIGS. 4c and 4d by the insulators 246a and 246b so that the anodes are not electrically connected to ground shields. The end fittings 249–250 may be connected to vacuum equipment within which an end of a movable or fixed substrate 252 is mounted, or the entire assembly FIG. 4a may be mounted within a vacuum chamber of the nature that is shown in FIG. 1. Stainless steel screens 247 and 248 are secured to the ground shields 245–246 and have apertures therein through which the substrate 252 passes.

Exemplary substrates 252 may be wire which is to be coated, flat steel plate, and so forth. For example, supply and takeup drums may be coupled and sealed with the end fittings, with the drums and apparatus of FIG. 4 being evacuated, so as to supply wire 252 through the apparatus for coating cathode material onto the periphery of the wire. Alternatively, the end fittings may be coupled to a vacuum pass-through for supplying wire 252 through the apparatus of FIG. 4 for coating without requiring supply and takeup wire drums which are evacuated. As an additional embodiment a stinger may be used to mount a substrate or collection of substrates within the cathode or a conveyor arrangement may continually pass a series of substrates through the cathode.

An electrical lead 256 is connected to the left anode 216a as shown in FIG. 4a, and an electrical lead 257 is routed beneath the field winding 234 and connected to the right anode 216b. The lead 257 is mounted under the winding 234 to prevent sever transients being induced into the assembly of magnetic field coils 234 in the event of surges in the plasma discharge current. The leads 256 and 257 may be connected to ground in an exemplary embodiment, or to a positive potential is discussed previously with respect to bias sputtering, and a cathode lead 259 may be connected to the shell 215 and a source of negative voltage. Contact set screws 215e shown in FIG. 4c assure good electrical contact between the cathode barrel 214 and the housing 215. Suitable tubular channels connect with the anode cavities 223 and 224 and with the cathode cavities 215a and 214d for supplying cooling water thereto, it being appreciated that these pipes may be interconnected with a source of cooling water in any suitable manner similar to that discussed in connection with the apparatus of FIG. 2. Also, preferably the wire for the field winding 234 is hollow and also water cooled. O-ring seals (not shown) preferably are provided between the cathode barrel 214 and cathode flanges 214a-214b and between the anodes 216a-216b and anode end plates 221 and 222, and between the anode end plates and the magnetic end plates 237 and 238. O-ring seals 270–273 are used between the faces of the insulators 218-219 and the flanges 214a-214b and the anodes 216a-216b, and O-ring seals 274 and 275 are used between the seal rings 215b and 215c (FIGS. 4c and 4d) and the cathode assembly 214–215. Similar seals (not shown) are used at the faces of the insulators 241-242, and between plates 245–246 and fittings 249–250, and between the water cooled barrel 214 of FIG. 4c and end flange 214a and b when the embodiment is used.

It has been found in operation of apparatus of the nature of that illustrated in FIG. 4 that the same can be operated almost as low as three hundred volts because the product of $\epsilon_1$ times $\epsilon_2$ is close to unity. With the hollow cathode construction of FIG. 4, the operating current can be varied over a wide range at a given operating pressure, similar to that of the cathode construction of FIG. 2. The deposition rate with the hollow cathode construction, on the substrates 252 at the center of the cathode is, to the first order, independent of pressure and almost independent of voltage. Thus, pressure is essentially an independent parameter which can be varied for other reasons as desired, for example, to affect the nucleating processes on the substrate.

It is to be understood that the hollow cathode embodiment shown in FIG. 4 and described above provides essentially the same advantages as the spool cathode configuration shown in FIG. 2. Thus, in the hollow cathode configuration the electron trap exists, as mentioned previously, in a thin annular region extending from the cathode surface inward to the radius defined by the inside diameter of the anode. Because of the good anode connection afforded by this embodiment the desired electron energy gradient exists across the trap from the edge of the cathode sheath, (which extends only a few millimeters from the cathode surface) to the edge of the trap (i.e., the inside diameter of the anode). Accordingly, the electrons which leave the trap by inward radial diffusion and pass to the vicinity of the substrate rather than to the anode are of very low energy, i.e., 3 to 5 ev. That this is indeed the case has been verified by electrostatic probe measurements across the radius of the plasma. Accordingly, although the substrate heating from the surrounding plasma in the hollow cathode configuration is necessarily greater than in the spool cathode configuration where the plasma does not extend to the substrate, it is (in the hollow cathode embodiment described) much reduced from devices described in prior art because the plasma is made to be cool before it reaches the vicinity of the substrate.

Figure 5B:
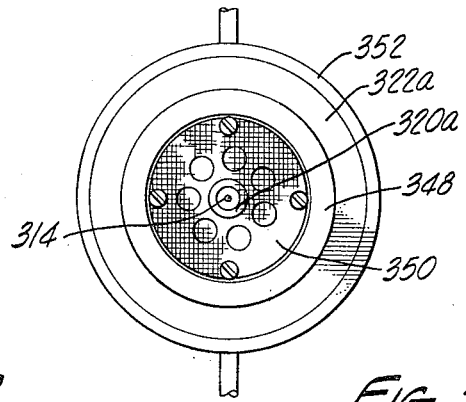
FIG. 5b is an end view thereof.
Figure 5A:
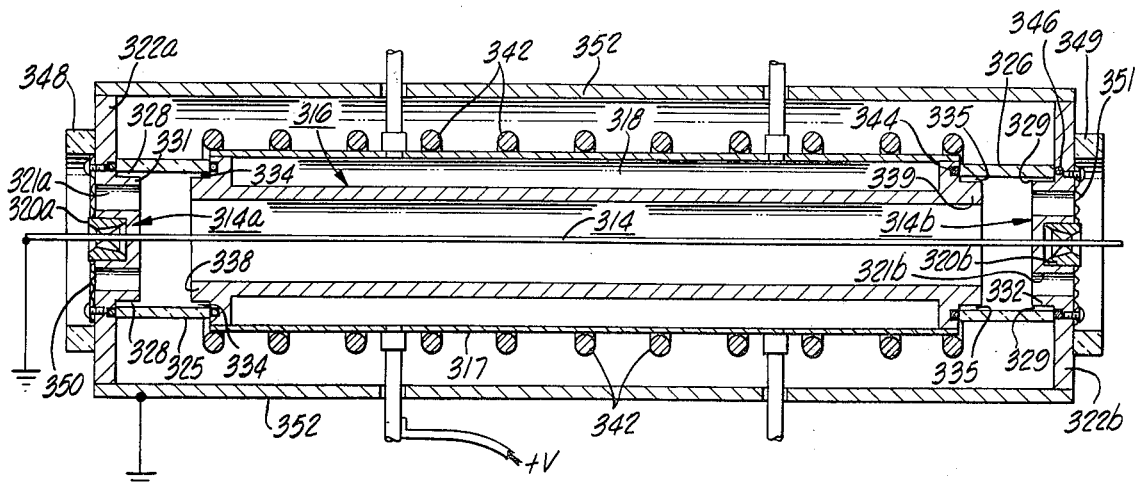
FIG. 5a is a cross-sectional elevational view of another form of discharge device according to the present invention.
Figure 5C:
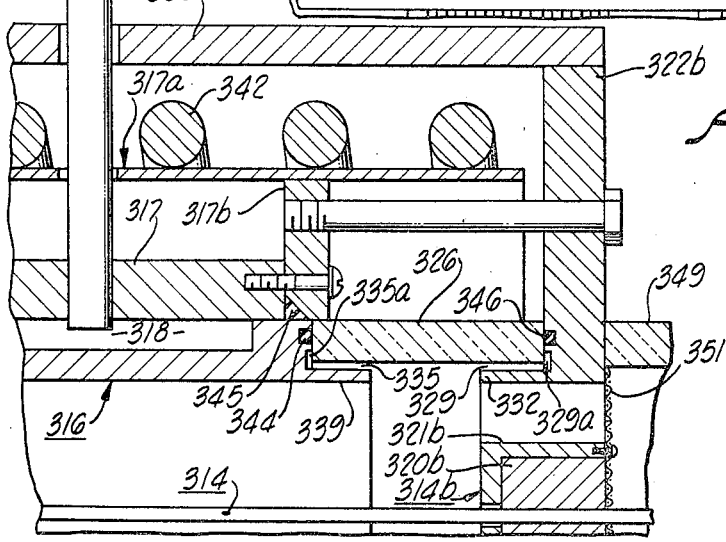
FIG. 5c is an enlarged fragmentary view showing more detail of the device of FIG. 5a and modifications thereof.

FIG. 5 illustrates another embodiment which is useful, for example, for wire cleaning wherein a steel wire, or the like, forms a cathode 314. As was the case with FIG. 4, FIG. 5a illustrates in general the entire apparatus and FIG. 5c shows the details of the preferred end construction. Only one half of the right end is shown, it being understood that each end preferably is symmetrical and alike. A plasma discharge is created between the wire cathode 314 and a cylindrical anode 316 which surrounds the wire. An axial magnetic field permits the discharge to be operated at sufficiently low pressure so that the contamination and/or other material sputtered from the wire surface can pass line-of-sight to the anode where it is collected. End flanges 314a and 314b are provided. The cylindrical anode 316 has a cylindrical cover or jacket 317 which is attached by seal rings, such as 317b as shown in FIG. 5c, to form a cavity 318 for cooling water. The inner surface of the anode preferably is knurled, grooved, and/or bead blasted to enhance the adhesion of sputtered material. The flanges 314a and 314b are alike, and each may incorporate a wire die 302a-320b for assisting in maintaining the wire position, a plurality of holes 321a-321b communicating between the interior of the apparatus and the interior of the vacuum chamber (not shown) surrounding the apparatus, and outer flange sections 322a-322b. Furthermore the end flanges are fabricated from a magnetic material such as steel so that they assist in shaping the magnetic field in much the same manner as the magnetic end plates 237 and 238 which were described with reference to FIG. 4. The apparatus may be secured together by bolts between the flange sections 322a-322b and the seal rings 317a-317b. The seal rings may be fabricated from an insulating material such as polycarbon plastic.

Insulators 325 and 326, which may be made of the same material as the insulator 70 of FIG. 2, are disposed between the anode 316 and the cathode flanges 314a-314b. Annular gaps 328 and 329 are provided between the inner surfaces of the insulators 325-326 and outer surfaces of respective skirts 331-335 are provided between the inner surfaces of the insulators 325-326 and the outer surfaces of the skirts 338-339 of the anode 316. As was the case with the devices previously described, additional gaps (329a and 335a in FIG. 5c) are provided at each end of the apparatus adjacent to the insulators which are directed so that they are perpendicular to the direction of the magnetic field lines. Suitable O-ring seals, such as provided by O-rings 344 and 346, are provided at each end of the insulators 325-326, and similar seals (345 in FIG. 5c) are provided between the seal rings 317a and 317b and the anode assembly 316 and 317. As was the case with the arrangement of FIGS. 2 and 4, suitable plastic pipes may be coupled with the anode 316 to supply cooling water to the cavity 318 thereof.

A field coil 342 similar to the field coil 234 of FIG. 4 is used, said coil being mounted on an insulating shield 317a (FIG. 5c) similar to the shield 234a of FIG. 4. End insulators 348-349 may be used and these may be formed of the same material as the insulators 325-326. End screens 350-351 on the exterior of the cathode flanges 314a-314b are used so as to assure that the plasma discharge is confined to the portion of the wire between the cathode flanges when the substrate wire is at ground potential. The wire 314 preferably is at ground potential so that the feed and takeup wire spools also will be at ground rather than at a high voltage. The problem is identical to that discussed with reference to bias sputtering in the apparatus shown in FIG. 4. That is, the screens assure that the positive biased anode 316 draws current only from the section of wire between the end flanges and shields, and does not draw current from the vacuum pumps and other grounded elements of the system.

When the apparatus of FIG. 5 is employed for sputtering of the wire 314 for cleaning thereof, the specific placement and configuration of the anode and cathode flanges is not as important as in the embodiments previously discussed, inasmuch as no attempt is being made to provide an even coating of sputtered material on a substrate or on the anode but it is merely desired to sputter material from the surface of the wire for cleaning thereof. Therefore, although such a device could be configured which satisfies the requirements of good anode connection, this requirement has been found to be less critical for this application since the required power levels are in general considerably less and the voltage drop between the anode and the plasma because of the interceding magnetic field has not been found to be a serious problem. However, because of the relative smallness of the wire 314, more field strength is desirable, and for this purpose an exterior magnetic shield in the form of a cylinder 352 secured to the cathode flanges 314a-314b is used. This cylinder is of magnetic material. A similar shield may be used with the apparatus of FIG. 4. Instead of a cylindrical anode 316, an anode ring or rings can be used about the cathode flanges.

It is to be understood that although specific constructions and configurations, as well as materials, have been discussed herein for devices according to the present invention, deviations can be made therein without departing from the spirit and scope of the present invention. For example, although the cathode flanges, such as 14a-14b, have been shown and described as configured in the form of flanges having parallel upper and lower surfaces, they can be configured in other manners deviating from the parallel, such as with the facing surface being arcuate or conical. The support means 15 can be eliminated and the cathode and end insulator structure directly attached to a wall of the vacuum chamber, with the chamber acting as the anode. Also, plural cathode structures can be used, such as in a ring forming a cage, within the chamber. Furthermore, although apparatus as described herein has been discussed from the standpoint of direct current operation, alternating current, or rf, operation can be achieved by separating the cathode into two parts with suitable insulation between the parts and with an a.c. source connected across these two parts or to one of these parts and another device such as the walls of a metal vacuum chamber. Also, devices as disclosed herein may be used as a control element inasmuch as the volt-ampere characteristics of the device are substantially nonlinear.

The present embodiments of this invention are to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A non-thermionic cathode structure for use in electrode glow discharge apparatus comprising
    cathode means including a central elongated portion having flanges at the ends thereof, and means coupling together said central portion and said flanges, said flanges and central portion having a cavity therein, and
    spool means mounted within said cathode means, said spool means having a central elongated portion mounted within the central portion of said cathode means and having wing portions mounted within the respective flanges of said cathode means.

2. The structure as claimed in claim 1, wherein said ends of said cathode means are outwardly extending flanges.

3. The apparatus as claimed in claim 1, wherein said central portion of said cathode means is in the form of a substantially cylindrical barrel and said ends are outwardly extending substantially cylindrical flanges on the ends of said barrel.

4. The apparatus as claimed in claim 1, wherein said cathode means is adapted to be mounted within a vacuum chamber, and includes magnetic field means having a field winding mounted within said central portion of said cathode means.

5. The apparatus as claimed in claim 1, wherein said cathode means is hollow and said ends extend inwardly.

6. The apparatus as claimed in claim 1, wherein said central portion of said cathode means includes a cavity for receiving cooling fluid therein.

* * * * *

UNITED STATES PATENT AND TRADEMARK OFFICE
CERTIFICATE OF CORRECTION

PATENT NO. : 3,995,187
DATED : November 30, 1976
INVENTOR(S) : Penfold et al.

It is certified that error appears in the above-identified patent and that said Letters Patent are hereby corrected as shown below:

Column 3, line 44, delete "elctron" and insert therefor --electron--; line 51, delete "tht" and insert therefor --that--.

Column 5, line 46, delete "21" (at first occurrence).

Column 10, line 35, delete "gag" and insert therefor --gap--.

Column 14, line 35, delete "may" and insert therefor --many--; line 45, delete "of" first occurence and insert -- or --.

Column 15, line 46, delete "the" (second occurrence).

Column 18, line 35, delete "by means of ring insulators"; delete "215" and insert therefor --215d--.

Signed and Sealed this second Day of August 1977

[SEAL]

Attest:

RUTH C. MASON
Attesting Officer

C. MARSHALL DANN
Commissioner of Patents and Trademarks